(12) United States Patent
Lee et al.

(10) Patent No.: US 11,791,841 B2
(45) Date of Patent: Oct. 17, 2023

(54) BIT FLIPPING DEVICE AND METHOD AND COMPUTER READABLE PROGRAM FOR THE SAME

(71) Applicant: Foundation of Soongsil University-Industry Cooperation, Seoul (KR)

(72) Inventors: Jaejin Lee, Seoul (KR); Seongkwon Jeong, Seoul (KR)

(73) Assignee: FOUNDATION OF SOONGSIL UNIVERSITY-INDUSTRY COOPERATION, Seoul (KR)

( * ) Notice: Subject to any disclaimer, the term of this patent is extended or adjusted under 35 U.S.C. 154(b) by 0 days.

(21) Appl. No.: 17/861,509

(22) Filed: Jul. 11, 2022

(65) Prior Publication Data
US 2023/0216523 A1 Jul. 6, 2023

(30) Foreign Application Priority Data
Jan. 4, 2022 (KR) ........................ 10-2022-0000909

(51) Int. Cl.
*H03M 13/11* (2006.01)
*H03M 13/00* (2006.01)
*H03M 13/41* (2006.01)

(52) U.S. Cl.
CPC .... *H03M 13/1108* (2013.01); *H03M 13/4138* (2013.01); *H03M 13/6343* (2013.01)

(58) Field of Classification Search
CPC ................................................ H03M 13/1108
See application file for complete search history.

(56) References Cited

U.S. PATENT DOCUMENTS 5,808,994 A * 9/1998 Tanaka ............. G11B 20/10009
369/59.19
2004/0148561 A1 * 7/2004 Shen ................. H03M 13/3738
714/803

(Continued)

FOREIGN PATENT DOCUMENTS

CN 112702080 A 4/2021
EP 1691519 A1 8/2006

(Continued)

OTHER PUBLICATIONS

Seongkwon Jeong and Jaejin Lee; Bit-Flipping Scheme Using K-Means Algorithm for Bit-Patterned Media Recording; IEEE Transactions on Magnetics, vol. 58, No. 8, Aug. 2022 (Year: 2022).*

(Continued)

*Primary Examiner* — Joseph D Torres
(74) *Attorney, Agent, or Firm* — Stein IP, LLC

(57) ABSTRACT

Provided are a bit flipping device and method and a computer readable program for the same. The bit flipping device for input data having a two-dimensional array pattern includes: a clustering unit configured to generate at least one input data sequence based on the two-dimensional array pattern of the input data and classify the input data sequence into at least one cluster according to a preset method; and a bit flipping unit configured to perform bit flipping on erroneous bits in the input data sequence based on the classified cluster. Therefore, it is possible to further reduce inefficiency while further reducing system complexity compared to the existing error correction code-based bit flipping method by coupling the bit flipping device to an output side of a partial response maximum likelihood (PRML) detector to classify an output value of the PRML detector into at least one cluster and perform bit flipping based on the classified result.

12 Claims, 6 Drawing Sheets

(56) References Cited

U.S. PATENT DOCUMENTS

| | | | | |
|---|---|---|---|---|
| 2007/0044006 A1* | 2/2007 | Yang | ................. | G11B 20/1833 |
| | | | | 714/785 |
| 2010/0169746 A1* | 7/2010 | Karabed | ................ | G11B 20/18 |
| | | | | 714/795 |
| 2014/0351672 A1* | 11/2014 | Marrow | .............. | H03M 13/453 |
| | | | | 714/764 |

FOREIGN PATENT DOCUMENTS

| KR | 10-2010-0080691 A | 7/2010 |
|---|---|---|
| KR | 10-2296738 B1 | 9/2021 |

OTHER PUBLICATIONS

Wiparat Busyatras, Chanon Warisarn; Soft-information flipping scheme based on a priori LLRs summation for ultra-high density magnetic recording; Article in AIP Advances, Feb. 2020; AIP Advances 10, 025217 (2020) (Year: 2020).*

* cited by examiner

BIT FLIPPING DEVICE AND METHOD AND COMPUTER READABLE PROGRAM FOR THE SAME

CROSS-REFERENCE TO RELATED APPLICATION

This application claims priority to and the benefit of Korean Patent Application No. 10-2022-0000909, filed on Jan. 4, 2022, the disclosure of which is incorporated herein by reference in its entirety.

BACKGROUND

1. Field of the Invention

The present invention relates to a device and method for bit flipping and a computer readable program for the same, and more particularly, to a bit flipping device and method for performing bit flipping on erroneous bits in input data, and a computer readable program for the same.

2. Discussion of Related Art

Recently, as the amount of information handled has rapidly increased due to rapid industrialization and informatization, there has arisen a need to increase an areal density (AD) of hard disk drives (HDDs).

Meanwhile, bit pattern media recording (BPMR) that may increase the AD has been spotlighted as a next-generation magnetic storage system. A BPMR system may achieve AD that exceeds 1 terabit per square inch ($Tb/in^2$). To this end, a BPMR arranges islands with slight spacing in a down-track direction and a cross-track direction, and stores 1 bit for each island. In this case, to increase the AD, the inter-island spacing needs to be reduced, which leads to problems of inter-symbol interference (ISI) and inter-track interference (ITI).

Therefore, various signal processing technologies have been developed to alleviate the problems of ISI and ITI for BPMR.

As one of these signal processing techniques, a bit flipping technology of changing a value of one bit from 0 to 1 or from 1 to 0, or changing a sign to change a value of data predicted to be erroneous may be considered.

For example, a low-density parity check (LDPC) decoder, which is one of the conventional bit flipping technologies, is a technology of using characteristics of an error correction code to change a code of a bit predicted as an error. The conventional bit flipping technology has a problem in that an encoder at a transmitting end and a decoder at a receiving end are required separately, which leads to problems of increasing system complexity and lowering data inefficiency.

Accordingly, there is a need for a bit flipping technology capable of reducing data inefficiency without increasing system complexity.

SUMMARY OF THE INVENTION

The present invention is directed to providing a bit flipping device and method for generating an input data sequence based on a two-dimensional array pattern of input data, classifying the input data sequence into at least one cluster, and then performing bit flipping on erroneous bits in the input data based on the classified cluster, and a computer readable program for the same.

According to an aspect of the present invention, a bit flipping device for input data having a two-dimensional array pattern includes: a clustering unit configured to generate at least one input data sequence based on the two-dimensional array pattern of the input data and classify the input data sequence into at least one cluster according to a preset method; and a bit flipping unit configured to perform bit flipping on an erroneous bit in the input data sequence based on the classified cluster.

The input data may be an output value from a partial response maximum likelihood (PRML) detector that equalizes a readback signal passing through a predetermined channel into a pulse form of a partial response and decodes the readback signal according to a soft decision Viterbi algorithm.

The input data may have the two-dimensional array pattern including a plurality of islands in a down-track direction and a plurality of islands in a cross-track direction.

The clustering unit may include a preprocessing unit configured to generate the input data sequence by extracting a predetermined center bit and at least one neighboring bit adjacent to the center bit, set the number of clusters based on the number of bits constituting the input data sequence, and initialize as many centroids as the set number of clusters, a classification unit configured to classify the input data sequence into a cluster closest to the input data sequence, and a conversion unit configured to convert an index value of the classified cluster into a binary sequence.

The bit flipping unit may perform bit flipping on an erroneous bit in the input data sequence by comparing the converted binary sequence with a sign of each component of the input data sequence and changing the sign of the input data sequence having a different sign.

The preset method may follow a K-mean algorithm.

The preprocessing unit may sample the center bit located in a predetermined island, and generate the input data sequence by sampling neighboring bits from at least one island in the down-track direction or at least one island in the cross-track direction based on the island in which the center bit is sampled.

The preprocessing unit may sample the center bit located in a predetermined island, and generate the input data sequence by sampling the neighboring bits from at least one island in the down-track direction or at least one island in the cross-track direction based on the island in which the center bit is sampled.

The preprocessing unit may generate the input data sequence by sampling the center bit located in a predetermined island and sampling the neighboring bits in all islands adjacent to the island in which the center bit is sampled.

According to another aspect of the present invention, a bit flipping method of input data having a two-dimensional array pattern performed in a bit flipping device includes generating at least one input data sequence based on the two-dimensional array pattern of the input data and classifying the input data sequence into at least one cluster according to a preset method, and performing bit flipping on an erroneous bit in the input data sequence based on the classified cluster.

The input data may be an output value from a PRML detector that equalizes a readback signal passing through a predetermined channel into a pulse form of a partial response and decodes the readback signal according to a soft decision Viterbi algorithm.

The classifying of the input data sequence into the at least any one cluster may include generating the input data sequence by extracting a predetermined center bit and at least one neighboring bit adjacent to the center bit, setting the number of clusters based on the number of bits constituting the input data sequence, and initializing as many centroids as the set number of clusters, classifying the input data sequence into a cluster closest to the input data sequence, and converting an index value of the classified cluster into a binary sequence.

The performing of the bit flipping may include performing the bit flipping on an erroneous bit in the input data sequence by comparing the converted binary sequence with a sign of each component of the input data sequence and changing the sign of the input data sequence having a different sign.

The preset method may follow a K-mean algorithm.

According to still another embodiment of the present invention, there is provided a computer readable program stored in a computer-readable recording medium configured to execute the bit flipping method.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
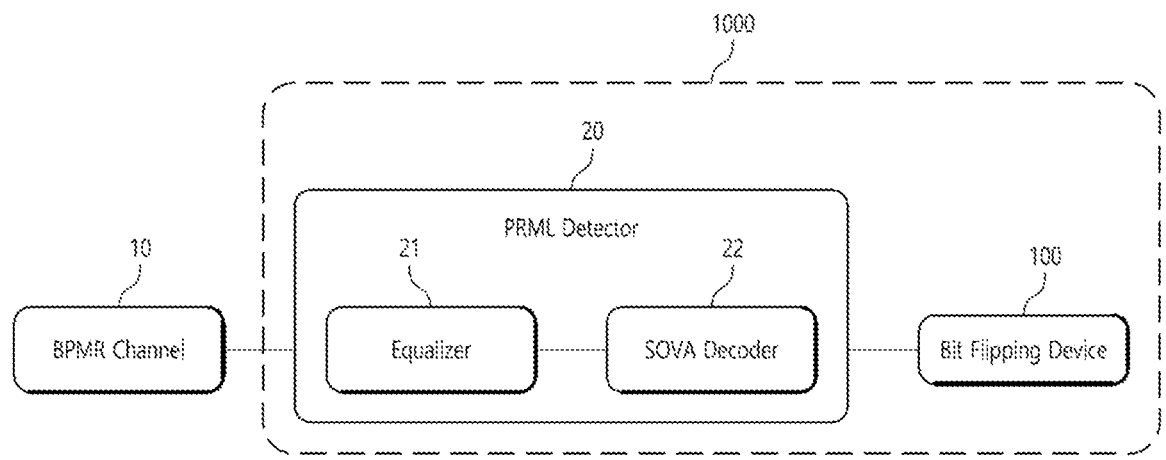
FIG. 1 is a diagram illustrating an example of a bit pattern media recording (BPMR) system to which a bit flipping device according to an embodiment of the present invention is applied.

The detailed description of the present invention set forth below refers to the accompanying drawings, which show by way of illustration specific embodiments in which the invention may be practiced. These embodiments will be described in detail for those skilled in the art in order to practice the present invention. It should be appreciated that various exemplary embodiments of the present invention are different from each other, but do not have to be exclusive. For example, specific shapes, structures, and characteristics described in the present specification may be implemented in another exemplary embodiment without departing from the spirit and the scope of the present invention in connection with an exemplary embodiment. In addition, it should be understood that a position or an arrangement of individual components in each disclosed exemplary embodiment may be changed without departing from the spirit and the scope of the present invention. Therefore, a detailed description described below should not be construed as being restrictive. In addition, the scope of the present invention is defined only by the accompanying claims and their equivalents if appropriate. Similar reference numerals will be used to describe the same or similar functions throughout the accompanying drawings.

The term "unit" is defined herein as having its broadest definition to ordinary skill in the art to refer to software including instructions executable in a non-transitory computer-readable medium that would perform the associated function when executed, a circuit designed to perform the associated function, hardware designed to perform the associated function, or a combination of software, a circuit, or hardware designed to perform the associated function.

Further, it is to be understood that all detailed descriptions mentioning specific embodiments of the present disclosure as well as principles, aspects, and embodiments of the present disclosure are intended to include structural and functional equivalences thereof. Further, it is to be understood that these equivalences include an equivalence that will be developed in the future as well as an equivalence that is currently well-known, that is, all elements invented so as to perform the same function regardless of a structure.

Therefore, it is to be understood that, for example, block diagrams of the present specification illustrate a conceptual aspect of an illustrative circuit for embodying a principle of the present disclosure. Therefore, it is to be understood that all flow charts, state transition diagrams, pseudo-codes, and the like, illustrate various processes that may be tangibly embodied in a computer-readable medium and that are executed by computers or processors regardless of whether or not the computers or the processors are clearly illustrated.

Functions of various elements including processors or functional blocks represented as concepts similar to the processors and illustrated in the accompanying drawings may be provided using hardware having capability to execute software in connection with appropriate software as well as dedicated hardware. When the functions are provided by the processors, they may be provided by a single dedicated processor, a single shared processor, or a plurality of individual processors, and some of them may be shared with each other.

In addition, the explicit use of terms presented as the processor, control, or similar concepts should not be interpreted exclusively by quoting hardware capable of executing software, but should be understood to implicitly include, without limitation, digital signal processor (DSP) hardware, a ROM for storing software, a RAM, and a non-volatile memory. The above-mentioned terms may also include well-known other hardware.

In the claims of the present specification, components represented as means for performing functions mentioned in a detailed description are intended to include all methods for performing functions including all types of software including, for example, a combination of circuit devices performing these functions, firmware/micro codes, or the like, and are coupled to appropriate circuits for executing the software so as to execute these functions. It is to be understood that since functions provided by variously mentioned means are combined with each other and are combined with a method demanded by the claims in the present disclosure defined by the claims, any means capable of providing these functions are equivalent to means recognized from the present specification.

Hereinafter, preferred embodiments of the present invention will be described in more detail with reference to the accompanying drawings.

Figure 2:
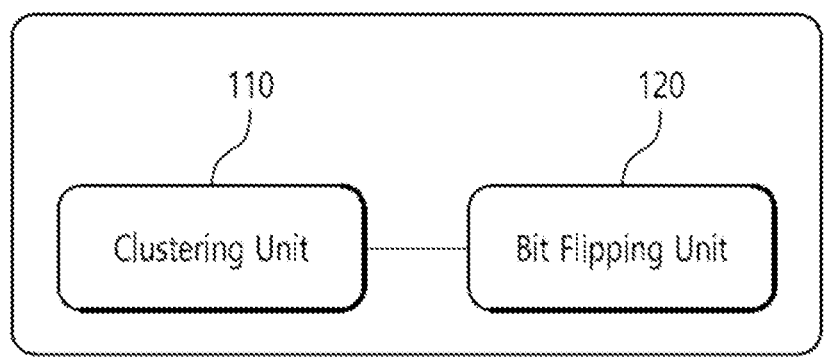
FIG. 2 is a diagram illustrating a configuration of the bit flipping device according to the embodiment of the present invention.
Figure 3:
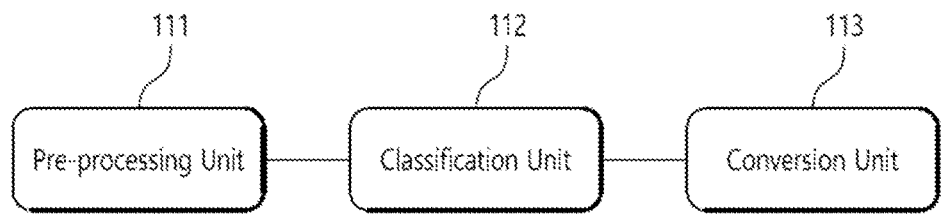
FIG. 3 is a diagram illustrating a detailed configuration of a clustering unit illustrated in FIG. 2.
Figure 4:
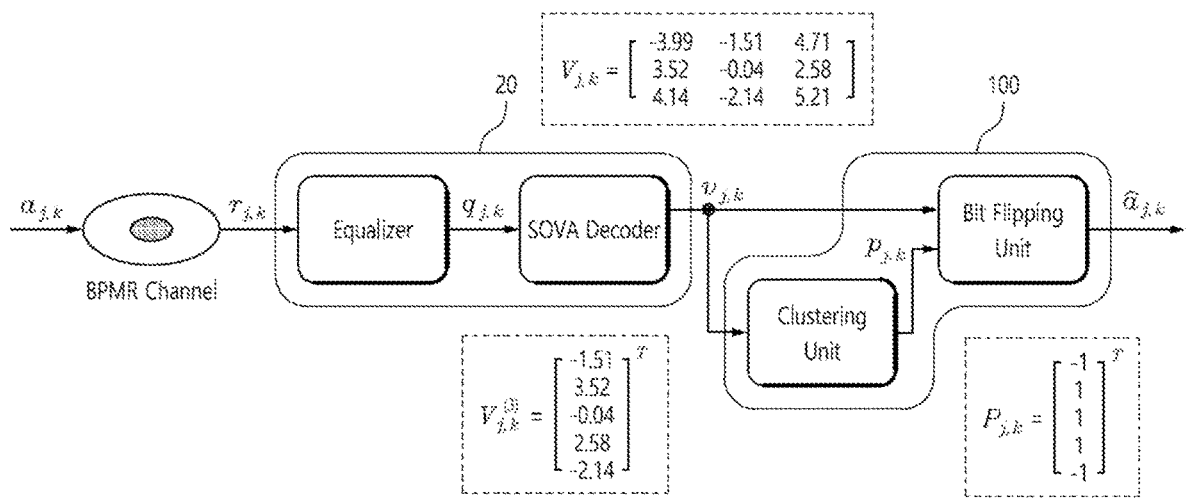
FIG. 4 is a diagram illustrating an example of a signal processing process of the BPMR system.

FIG. 1 is a diagram illustrating an example of a bit pattern media recording (BPMR) system to which a bit flipping device according to an embodiment of the present invention is applied, FIG. 2 is a diagram illustrating a configuration of the bit flipping device according to the embodiment of the present invention, FIG. 3 is a diagram illustrating a detailed configuration of a clustering unit illustrated in FIG. 2, FIG. 4 is a diagram illustrating an example of a signal processing process of the BPMR system, and FIGS. 5A-5D are diagrams illustrating an example of a process of generating an input data sequence in a preprocessing unit.

A bit pattern media recording (BPMR) system according to the present embodiment is a system for detecting a signal passing through a BPMR channel, and includes a BPMR channel 10 and a device 1000 for detecting a signal passing through the BPMR channel 10.

First, an input signal $a_{j,k}$ passes through the BPMR channel 10 and is input to the device 1000 as a readback signal $r_{j,k}$ to which additive white Gaussian noise (AWGN) is added.

The device 1000 may record information on a bit pattern medium or reproduce recorded information. This device 1000 may be mobile or may be stationary. For example, the device 1000 may be in the form of a server or an engine, and may be called by another term such as "device," "apparatus," "terminal," "user equipment (UE)," "mobile station (MS)," "wireless device," or "handheld device." In addition, the device may execute or manufacture various types of software based on an operating system (OS), that is, a system. The operating system is a system program for software to use the hardware of the device 1000, and may include both a mobile computer operating system such as Android OS, iOS, Windows Mobile OS, Bada OS, Symbian OS, or Blackberry OS and a computer operating system such as Windows series, Linux series, Unix series, MAC, AIX, or HP-UX.

In particular, the device 1000 according to the present embodiment may detect a signal based on partial response maximum likelihood in order to detect the signal passing through the BPMR channel 10, and may be executed by installing software (application) for performing bit flipping on erroneous bits in the detected signals therein. Hereinafter, a detailed configuration of the device 1000 will be described.

The device 1000 includes a partial response maximum likelihood (PRML) detector 20 and a bit flipping device 100. The PRML detector 20 and the bit flipping device 100 may be configured as one or separate devices.

First, the PRML detector 20 is a signal processor used for recording and reproducing data recorded on a high-density hard disk or a magneto-optical disk, and is a signal processor that combines a partial response (PR) method of increasing a recording density by limiting a band without using sudden and sharp cutoff characteristics and a Viterbi decoding method of selecting and reproducing a sequence that is closest to an encoded data sequence inserted to have a correlation before and after data is recorded. Accordingly, it is possible to minimize problems of inter-symbol interference (ISI) and inter-track interference (ITI).

To this end, the PRML detector 20 according to the present embodiment includes an equalizer 21 and a soft-output Viterbi algorithm (SOVA) decoder 22.

The equalizer 21 equalizes the readback signal $r_{j,k}$ in the form of a pulse of a PR, and outputs an equalized signal $q_{j,k}$ to the SOVA decoder 22. For example, the equalizer 21 may be a two-dimensional minimum mean square error (2D-MMSE) equalizer having a one-dimensional (1D) general PR (GPR) target based on minimum mean square error, but is not limited thereto.

The SOVA decoder 22 decodes an equalizer 21 side output signal $q_{j,k}$ according to the soft decision Viterbi algorithm and outputs a soft decision value $V_{j,k}$, and the soft decision value $V_{j,k}$ is input to the bit flipping device 100. The SOVA decoder 22 may be configured as a 1D SOVA detector, but is not limited thereto.

The bit flipping device 100 according to the present embodiment is coupled to an output side of the PRML detector 20, more specifically, an output side of the SOVA decoder 22, to perform the bit flipping on the erroneous bit included in the soft decision value $V_{j,k}$. To this end, the bit flipping device 100 includes a clustering unit 110 and a bit flipping unit 120.

The clustering unit 110 uses the soft decision value $V_{j,k}$ having a two-dimensional array pattern as input data to generate the input data sequence based on the two-dimensional array pattern of the input data $V_{j,k}$, and classifies the input data sequence into any one cluster according to the preset method.

Here, the preset method may follow the K-mean algorithm, which is an unsupervised learning method. The K-mean algorithm is one of partitioning clustering techniques in which prototype-based clusters are generated, and is an iterative clustering technique of identifying similar samples and assigning the identified samples to clusters. More specifically, the clustering method according to the K-mean algorithm includes initializing positions of a centroid, adjusting the positions of the centroid to an average value of added data while adding new data, and classifying each piece of data into a cluster with the closest centroid by repeating the above operations until the positions of the centroid are the same. Therefore, according to the present embodiment, unlike the machine learning technique that follows the supervised learning method, a separate learning and training process is not required.

Hereinafter, a detailed configuration of the clustering unit 110 for clustering the input data sequence according to the K-mean algorithm will be described.

The clustering unit 110 includes a preprocessing unit 111, a classification unit 112, and a conversion unit 113.

The preprocessing unit 111 generates the input data sequence by extracting a predetermined center bit and at least one neighboring bit adjacent to the center bit. In this case, the center bit may be sampled based on the two-dimensional array pattern of the input data.

Meanwhile, the input data has a two-dimensional array pattern including a plurality of islands in a down-track direction and a plurality of islands in a cross-track direction, and each island may store 1 bit. For example, when the soft decision value $V_{j,k}$ has a 3×3 two-dimensional array according to Equation 1 below, in the 3×3 two-dimensional array pattern configured as illustrated in FIGS. 5A-5D, each component of the soft decision value $V_{j,k}$ is stored in the island of the corresponding position.

$$V_{j,k} = \begin{bmatrix} v_{j-1,k-1} & v_{j-1,k} & v_{j-1,k+1} \\ v_{j,k-1} & v_{j,k} & v_{j,k+1} \\ v_{j+1,k-1} & v_{j+1,k} & v_{j+1,k+1} \end{bmatrix} \quad \text{[Equation 1]}$$

Figure 5A:
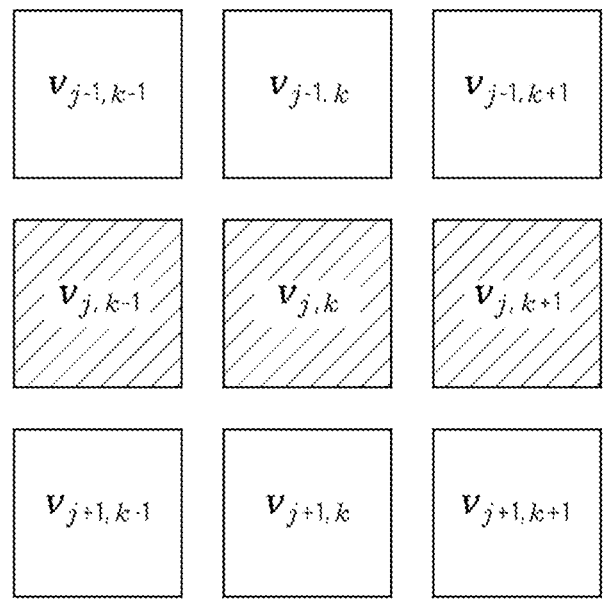
FIGS. 5A-5D are diagrams illustrating an example of a process of generating an input data sequence in a preprocessing unit.

The preprocessing unit 111 may sample a center bit located in a predetermined island based on the two-dimensional array pattern, and sample neighboring bits from at least one or more islands in the down-track direction or at least one or more islands in the cross-track direction based on the island where the center bit is sampled to generate the input data sequence. For example, as illustrated in FIG. 5A, the preprocessing unit 111 may sample neighboring bits $V_{j,k-1}$ and $V_{j,k+1}$ from two islands in the down-track direction based on the center bit $V_{j,k}$ to generate first input data $V_{j,k}^{(1)}$ according to Equation 2 below.

$$v_{j,k}^{(1)} = [v_{j,k-1} v_{j,k} v_{j,k+1}] \quad \text{[Equation 2]}$$

Figure 5B:
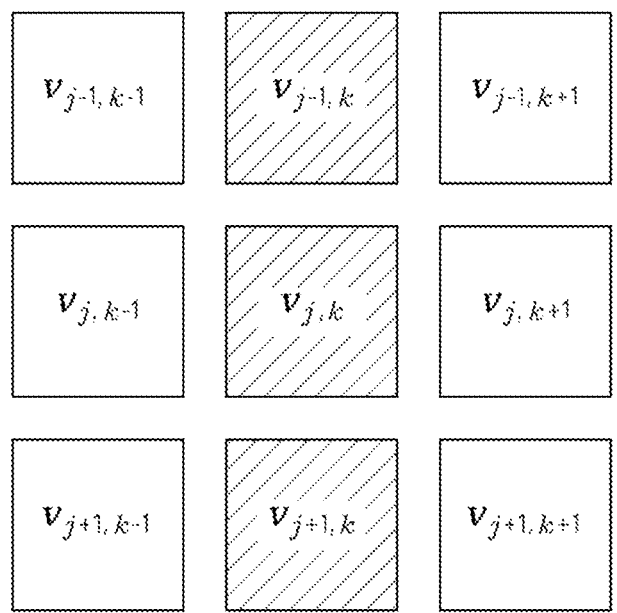

In addition, as illustrated in FIG. 5B, the preprocessing unit 111 may sample the neighboring bits $V_{j,k-1}$ and $V_{j,k+1}$ from two islands in the cross-track direction based on the center bit Vj,k to generate the second input data sequence Vj,k$^{(2)}$ according to Equation 3 below.

$$v_{j,k}^{(2)} = [v_{j-1,k} v_{j,k} v_{j+1,k}] \quad \text{[Equation 3]}$$

Figure 5C:
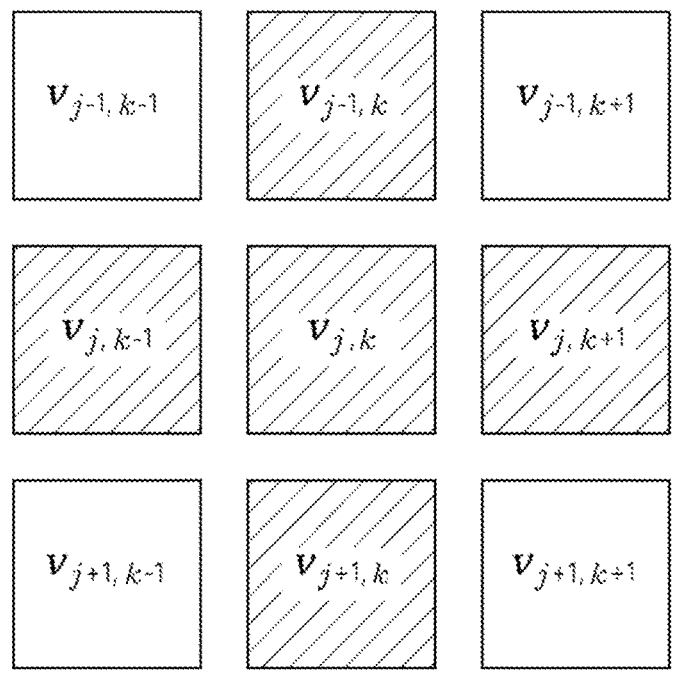

In addition, the preprocessing unit 111 may sample the center bit located in a predetermined island, and sample neighboring bits from at least one island in a down-track direction and at least one island in a cross-track direction based on the island from which the center bit is sampled to generate the input data sequence. For example, as illustrated in FIG. 5C, the preprocessing unit 111 may sample neighboring bits $V_{j-1,k}$, $V_{j,k-1}$, $V_{j,k+1}$, and $V_{j+1,k}$ from two islands in the down-track direction and two islands in the cross-track direction based on the center bit $V_{j,k}$ to generate third input data $V_{j,k}^{(3)}$ according to Equation 4 below.

$$v_{j,k}^{(3)} = [v_{j-1,k} v_{j,k-1} v_{j,k} v_{j,k+1} v_{j+1,k}] \quad \text{[Equation 4]}$$

Figure 5D:
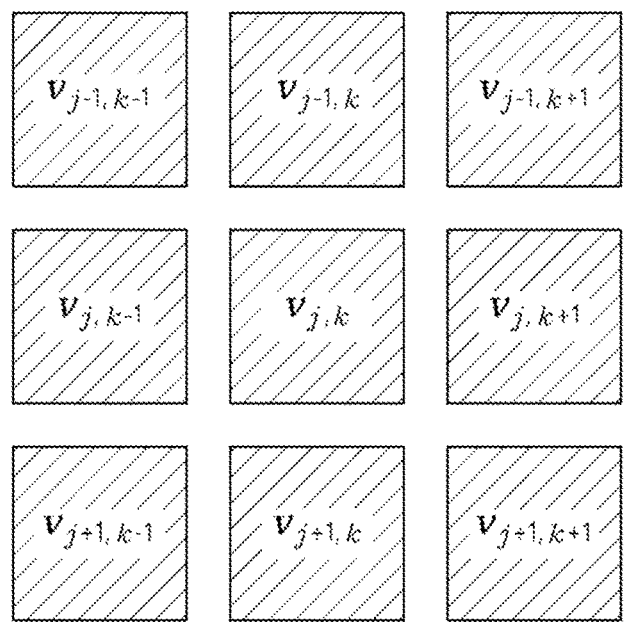

In addition, the preprocessing unit 111 may sample the center bit located in a predetermined island and sample neighboring bits from all islands adjacent to the island in which the center bit is sampled to generate the input data sequence. For example, as illustrated in FIG. 5D, the preprocessing unit 111 may sample neighboring bits $V_{j-1,k-1}$, $V_{j-1,k}$, $V_{j-1,k+1}$, $V_{j,k-1}$, $V_{j,k+1}$, $V_{j+1,k-1}$, $V_{j+1,k}$, and $V_{j+1,k+1}$ from all islands adjacent to the center bit $V_{j,k}$ to generate fourth input data $V_{j,k}^{(4)}$ according to Equation 5 below.

$$v_{j,k}^{(4)} = [v_{j-1,k-1} v_{j-1,k} v_{j-1,k+1} v_{j,k-1} v_{j,k} v_{j,k+1} \\ v_{j+1,k-1} v_{j+1,k} v_{j+1,k+1}] \quad \text{[Equation 5]}$$

Meanwhile, although the preprocessing unit 111 according to the present embodiment samples neighboring bits from neighboring islands in the down-track direction and the cross-track direction based on the island where the center bit is located to generate the input data sequence, this is only an example, and it may sample bits from predetermined islands adjacent to each other in a two-dimensional array pattern in another way to generate the input data sequence.

After configuring the input data sequence as described above, the preprocessing unit 111 sets the number of clusters based on the number of bits constituting the input data sequence, and initializes as many centroids as the set number of clusters. The preprocessing unit 111 counts the number L of bits constituting the input data sequence, and sets the number of candidate clusters for which the input data sequence is to be classified to $2^L$. Also, the preprocessing unit 111 initializes the position of the centroid, which is each center of the cluster set in this way. For example, when the number of bits constituting the input data sequence is 3, the number of clusters is 8, which is $2^3$, and the corresponding input data sequence may be classified into any one of 8 candidate clusters. In addition, the preprocessing unit may initialize the position of the centroid, which is a center of each of the eight clusters, to be $\{[-1, -1, -1], [-1, -1, 1], [-1, 1, -1], [-1, 1, 1], [1, -1, -1], [1, -1, 1], [1, 1, -1], [1, 1, 1]\}$.

The classification unit 112 classifies the input data sequence into a cluster into which the most similar data is classified according to the K-mean algorithm described above. The classification unit 112 may classify the input data sequence into a cluster closest to the input data sequence.

The conversion unit 113 converts an index value of the classified cluster into a binary sequence. The conversion unit 113 converts the index value, which is a decimal number, into the form of a binary sequence in order to compare the index value with the output value $V_{j,k}$ of the PRML detector 20. The index value is output as $p_{j,k}$ to the bit flipping unit 120 side.

The bit flipping unit 120 performs the bit flipping on the erroneous bits in the input data based on the clusters classified by the clustering unit 110. More specifically, as expressed in Equation 6 below, the bit flipping unit 120 compares the index value $p_{j,k}$ of the cluster converted into the binary sequence by the conversion unit 113 into a binary sequence with signs of each component value of the input data sequence, and changes the sign of the corresponding component value of the input data sequence having a different sign as the comparison result and outputs $\hat{a}_{j,k}$.

$$\hat{a}_{j,k} = \begin{cases} v_{j,k}, & \text{if } \text{sgn}(v_{j,k}) = \text{sgn}(p_{j,k}) \\ -v_{j,k}, & \text{else} \end{cases} \quad \text{[Equation 6]}$$

For example, as illustrated in FIG. 4, when the output value $V_{j,k}$ of the PRML detector 20 follows [−3.99, −1.51, 4.71; 3.52, −0.04, 2.58; 4.14, −2.14, 5.21], the input data sequence is [−1.51, 3.52, −0.04, 2.58, −2.14] and the corresponding input data sequence is classified into the cluster of "index 14" according to the K-mean algorithm, [−1,1,1, 1,−1], which is a binary sequence value of "14," is output as the output value of the clustering unit 110. The bit flipping unit 120 compares a corresponding input data sequence ([−1.51, 3.52, 0.04, 2.58, −2.14]) with an output value ([−1, 1, 1, 1, −1]) of the clustering unit 110, checks a component ("−0.04") of the input data sequence with a different sign, and outputs the value with the sign changed ("0.04").

According to the present invention described above, the bit flipping device is coupled to the output side of the PRML detector to classify the output value of the PRML detector into at least any one cluster, and performs the bit flipping based on the classified result, and therefore, there is an advantage in that inefficiency can be reduced while the complexity of the system is reduced as compared to the conventional bit flipping method based on the error correction code.

Figure 6:
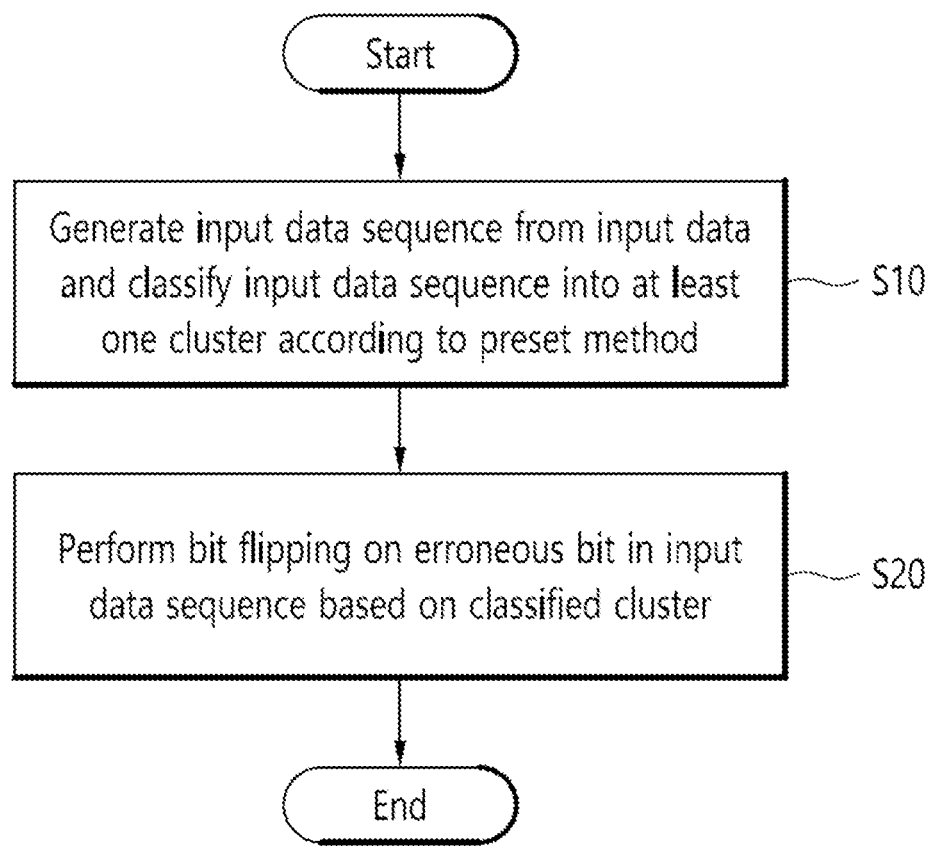
FIG. 6 is a flowchart illustrating a bit flipping method according to another embodiment of the present invention.

FIG. 6 is a flowchart illustrating a bit flipping method according to another embodiment of the present invention.

The bit flipping method according to the present embodiment is a bit flipping method for input data having a two-dimensional array pattern performed by a bit flipping device, and includes generating at least one input data sequence based on a two-dimensional array pattern from an input data sequence in the clustering unit 110 and classifying the input data sequence into at least one cluster according to a preset method (S10) and performing bit flipping on an erroneous bit in the input data sequence based on the classified cluster in the bit flipping unit 120 (S20).

Meanwhile, the input data may equalize the readback signal passing through a predetermined channel in the form of the PR pulse, and may be an output value from the PRML detector that decodes the equalized readback signal according to the soft decision Viterbi algorithm.

In addition, the classifying of the input data sequence into the at least any one cluster (S10) follows the K-mean algorithm, and more specifically, may include a preprocessing operation of extracting a predetermined center bit and at least one or more neighboring bits adjacent to the center bit to generate the input data sequence, setting the number of clusters based on the number of bits constituting the input data sequence and initializing as many centroids as the set number of clusters, an operation of classifying the input data sequence into a cluster closest to the input data sequence, and an operation of converting an index value of the classified cluster into a binary sequence.

In addition, in the performing of the bit flipping (S20), the bit flipping may be performed on the erroneous bits in the input data sequence by comparing the signs of each component of the converted binary sequence with the input data sequence and changing the sign of the input data sequence having a different sign.

Figure 7:
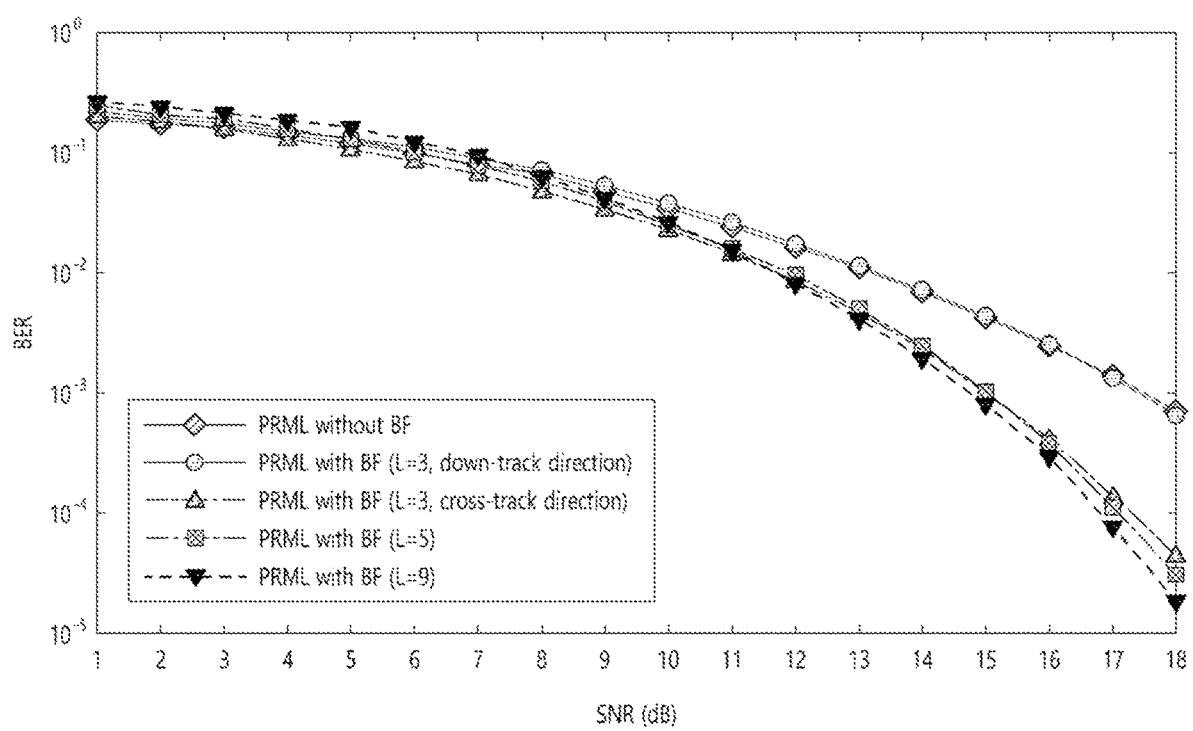
FIG. 7 is a diagram illustrating a bit error rate (BER) according to the present invention.

FIG. 7 is a diagram illustrating a bit error rate (BER) according to the bit flipping method illustrated in FIG. 6. As illustrated in FIG. 7, it may be seen that, as the number of components of the input data sequence increases, the bit flipping becomes more effective. That is, the more the surrounding data is considered, the better the performance.

The operation by the bit flipping method according to the embodiments described above may be at least partially implemented as a computer program and recorded on a computer-readable recording medium. A program for implementing the operation by the bit flipping method according to the embodiments is recorded and the computer-readable recording medium includes all types of recording devices in which computer-readable data is stored. An example of the computer readable recording medium may include a read only memory (ROM), a random access memory (RAM), a compact disk read only memory (CD-ROM), a magnetic tape, a floppy disk, an optical data storage, or the like. In addition, the computer readable recording medium may be distributed in computer systems connected to each other through a network, such that the computer readable codes may be stored in a distributed scheme and executed. In addition, functional programs, codes, and code segments for implementing the present embodiment may be easily understood by those skilled in the art to which the present embodiment pertains.

According to the present invention described above, it is possible to further reduce inefficiency while further reducing system complexity compared to the existing error correction code-based bit flipping method by coupling a bit flipping device to an output side of a PRML detector to classify an output value of the PRML detector into at least one cluster and perform bit flipping based on the classified result.

Although the embodiments of the present invention have been disclosed hereinabove, it may be understood by those skilled in the art that the present invention may be variously modified and altered without departing from the scope and spirit of the present invention described in the following claims.

What is claimed is:

1. A bit flipping device for input data having a two-dimensional array pattern, the bit flipping device comprising:
one or more processors; and
a memory for storing one or more instructions,
wherein the one or more processors execute the stored one or more instructions to perform operations comprising:
receiving the input data from a partial response maximum likelihood (PRML) detector, wherein the PRML detector recovers the input data from a readback signal passing through a bit pattern media recording (BPMR) channel by equalizing the readback signal into a pulse form of a partial response and decodes the readback signal according to a soft decision Viterbi algorithm;
generating at least one input data sequence based on the two-dimensional array pattern of the input data and classifying the at least one input data sequence into at least one cluster according to a preset method; and
performing bit flipping on an erroneous bit in the at least one input data sequence based on the classified cluster,
wherein the two-dimensional array pattern of the input date includes a plurality of islands in a down-track direction and a plurality of islands in a cross-track direction,
wherein the classifying of the at least one input data sequence into the at least one cluster comprises:
generating the at least one input data sequence by extracting a predetermined center bit and at least one neighboring bit adjacent to the center bit, setting a number of clusters based on a number of bits constituting the input data sequence, and initializing as many centroids as the set number of clusters;
classifying the input data sequence into a cluster closest to the input data sequence; and
converting an index value of the classified cluster into a binary sequence.

2. The bit flipping device of claim 1, wherein the performing of the bit flipping comprises performing the bit flipping on the erroneous bit in the at least one input data sequence by comparing the converted binary sequence with a sign of each component of the input data sequence and changing the sign of the input data sequence having a different sign.

3. The bit flipping device of claim 1, wherein the preset method follows a K-mean algorithm.

4. The bit flipping device of claim 1, wherein the generating of the at least one input data sequence comprises generating the at least one input data sequence by sampling the center bit located in a predetermined island and by sampling the at least one neighboring bit from at least one island in the down-track direction or at least one island in the cross-track direction based on the predetermined island in which the center bit is sampled.

5. The bit flipping device of claim 1, wherein the generating of the at least one input data sequence comprises generating the at least one input data sequence by sampling the center bit located in a predetermined island and by sampling the at least one neighboring bit from at least one island in the down-track direction and at least one island in the cross-track direction based on the predetermined island in which the center bit is sampled.

6. The bit flipping device of claim 1, wherein the generating of the at least one input data sequence comprises generating the at least one input data sequence by sampling the center bit located in a predetermined island and sampling the at least one neighboring bit in all islands adjacent to the predetermined island in which the center bit is sampled.

7. A bit flipping method of input data having a two-dimensional array pattern performed in a bit flipping device, the bit flipping method comprising:
receiving the input data from a partial response maximum likelihood (PRML) detector, wherein the PRML detector recovers the input data from a readback signal passing through a bit pattern media recording (BPMR) channel by equalizing the readback signal into a pulse form of a partial response and decodes the readback signal according to a soft decision Viterbi algorithm;

generating at least one input data sequence based on the two-dimensional array pattern of the input data and classifying the at least one input data sequence into at least one cluster according to a preset method; and performing bit flipping on an erroneous bit in the at least one input data sequence based on the classified cluster, wherein the two-dimensional array pattern of the input date includes a plurality of islands in a down-track direction and a plurality of islands in a cross-track direction, wherein the classifying of the at least one input data sequence into the at least one cluster comprises:

generating the at least one input data sequence by extracting a predetermined center bit and at least one neighboring bit adjacent to the center bit, setting a number of clusters based on a number of bits constituting the input data sequence, and initializing as many centroids as the set number of clusters;

classifying the input data sequence into a cluster closest to the input data sequence; and converting an index value of the classified cluster into a binary sequence.

8. The bit flipping method of claim 7, wherein the performing of the bit flipping comprises performing the bit flipping on the erroneous bit in the at least one input data sequence by comparing the converted binary sequence with a sign of each component of the input data sequence and changing the sign of the input data sequence having a different sign.

9. The bit flipping method of claim 7, wherein the preset method follows a K-mean algorithm.

10. A non-transitory computer-readable recording medium comprising a computer readable program stored thereon configured to execute a bit flipping method of input data having a two-dimensional array pattern performed in a bit flipping device, the bit flipping method comprising:

receiving the input data from a partial response maximum likelihood (PRML) detector, wherein the PRML detector recovers the input data from a readback signal passing through a bit pattern media recording (BPMR) channel by equalizing the readback signal into a pulse form of a partial response and decodes the readback signal according to a soft decision Viterbi algorithm;

generating at least one input data sequence based on the two-dimensional array pattern of the input data and classifying the at least one input data sequence into at least one cluster according to a preset method; and performing bit flipping on an erroneous bit in the at least one input data sequence based on the classified cluster, wherein the two-dimensional array pattern of the input date includes a plurality of islands in a down-track direction and a plurality of islands in a cross-track direction, wherein the classifying of the at least one input data sequence into the at least one cluster comprises:

generating the at least one input data sequence by extracting a predetermined center bit and at least one neighboring bit adjacent to the center bit, setting a number of clusters based on a number of bits constituting the input data sequence, and initializing as many centroids as the set number of clusters;

classifying the input data sequence into a duster closest to the input data sequence; and converting an index value of the classified cluster into a binary sequence.

11. The non-transitory computer-readable recording medium of claim 10, wherein the performing of the bit flipping comprises performing the bit flipping on the erroneous bit in the at least one input data sequence by comparing the converted binary sequence with a sign of each component of the input data sequence and changing the sign of the input data sequence having a different sign.

12. The non-transitory computer-readable recording medium of claim 10, wherein the preset method follows a K-mean algorithm.

* * * * *